United States Patent
Zimmerman, Sr. et al.

(10) Patent No.: US 10,952,349 B2
(45) Date of Patent: Mar. 16, 2021

(54) SCALABLE COOLANT DISTRIBUTION UNIT

(71) Applicant: Hewlett Packard Enterprise Development LP, Houston, TX (US)

(72) Inventors: Sammy L. Zimmerman, Sr., Houston, TX (US); Tuong Q. Tran, Houston, TX (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 187 days.

(21) Appl. No.: 15/546,056

(22) PCT Filed: Jan. 30, 2015

(86) PCT No.: PCT/US2015/013977
§ 371 (c)(1),
(2) Date: Jul. 25, 2017

(87) PCT Pub. No.: WO2016/122665
PCT Pub. Date: Aug. 4, 2016

(65) Prior Publication Data
US 2017/0374761 A1 Dec. 28, 2017

(51) Int. Cl.
*H05K 7/20* (2006.01)
*F25D 17/02* (2006.01)

(52) U.S. Cl.
CPC ......... *H05K 7/20281* (2013.01); *F25D 17/02* (2013.01); *H05K 7/20272* (2013.01); *H05K 7/20763* (2013.01); *H05K 7/20836* (2013.01)

(58) Field of Classification Search
CPC ........... H05K 7/20281; H05K 7/20272; H05K 7/20763; H05K 7/20836; F25D 17/02
See application file for complete search history.

(56) References Cited

U.S. PATENT DOCUMENTS

| | | | |
|---|---|---|---|
| 5,086,829 A | * | 2/1992 | Asakawa ........... H05K 7/20281 165/104.33 |
| 6,182,742 B1 | * | 2/2001 | Takahashi ......... H05K 7/20281 165/104.33 |

(Continued)

FOREIGN PATENT DOCUMENTS

| | | |
|---|---|---|
| CN | 1773465 A | 5/2006 |
| CN | 1893802 A | 1/2007 |

(Continued)

OTHER PUBLICATIONS

Shimazaki et al., Computer Room Air Conditioning System and Redundant Controller Therefor, Dec. 8, 2011, JP2011247516A, Whole Document (Year: 2011).*

(Continued)

*Primary Examiner* — Larry L Furdge
(74) *Attorney, Agent, or Firm* — Brooks, Cameron & Huebsch, PLLC

(57) ABSTRACT

In one implementation, a system for scalable coolant distribution unit includes a parameters engine to determine real time pump parameters of a first CDU, wherein the real time pump parameters correspond to a functionality of the first CDU, a pump engine to alter pump parameters of the first CDU based on the real time pump parameters, a communication engine to send the altered pump parameters of the first CDU to a second CDU, the pump engine to alter pump parameters of the second CDU based on the altered pump parameters of the first CDU and determined real time pump parameters of the second CDU, a functionality engine to determine a functionality of the first CDU and the second CDU based on the real time pump parameters and altered pump parameters.

19 Claims, 6 Drawing Sheets

(56) References Cited

U.S. PATENT DOCUMENTS

| | | | |
|---|---|---|---|
| 6,321,695 B1 | 11/2001 | Yoo et al. | |
| 7,508,665 B1 | 3/2009 | Palmer | |
| 7,907,406 B1 | 3/2011 | Campbell et al. | |
| 2005/0122685 A1* | 6/2005 | Chu | H05K 7/2079 361/699 |
| 2006/0101833 A1 | 5/2006 | Lucas et al. | |
| 2007/0165377 A1 | 7/2007 | Rasmussen | |
| 2010/0078160 A1 | 4/2010 | Novotny | |
| 2010/0236772 A1 | 9/2010 | Novotny | |
| 2011/0265983 A1 | 11/2011 | Pedersen | |
| 2011/0317367 A1* | 12/2011 | Campbell | H05K 7/203 361/700 |
| 2013/0104383 A1 | 5/2013 | Campbell et al. | |
| 2013/0138252 A1 | 5/2013 | Chainer | |
| 2014/0202678 A1* | 7/2014 | Goth | H05K 7/20772 165/287 |

FOREIGN PATENT DOCUMENTS

| | | | |
|---|---|---|---|
| CN | 102422230 | | 4/2012 |
| CN | 102971588 A | | 3/2013 |
| CN | 103460150 A | | 12/2013 |
| CN | 103671059 A | | 3/2014 |
| CN | 103699195 A | | 4/2014 |
| JP | 2011247516 A | * | 12/2011 |
| TW | 200730778 A | | 8/2007 |
| TW | I437167 | | 5/2014 |

OTHER PUBLICATIONS

Rongliang Zhou, "Data Center Cooling Management and Analysis—A Model Based Approach," Jan. 4, 2012.

Engine Discussion Stack Exchange; What makes a piece of software an Engine?, (https://softwareengineering.stackexchange.com/questions/108613/what-...), 4 pages.

* cited by examiner

SCALABLE COOLANT DISTRIBUTION UNIT

BACKGROUND

A coolant distribution unit (CDU) can deliver conditioned liquid (e.g., water) to a number of racks in a datacenter. The CDUs within a datacenter can operate with redundancy to ensure that if one or more CDUs malfunction that additional CDUs can maintain cooling of the racks. A number of CDUs can each include an individual reservoir to contain excess liquid for utilizing with a cooling system coupled to the number of CDUs.

DETAILED DESCRIPTION

Figure 1:
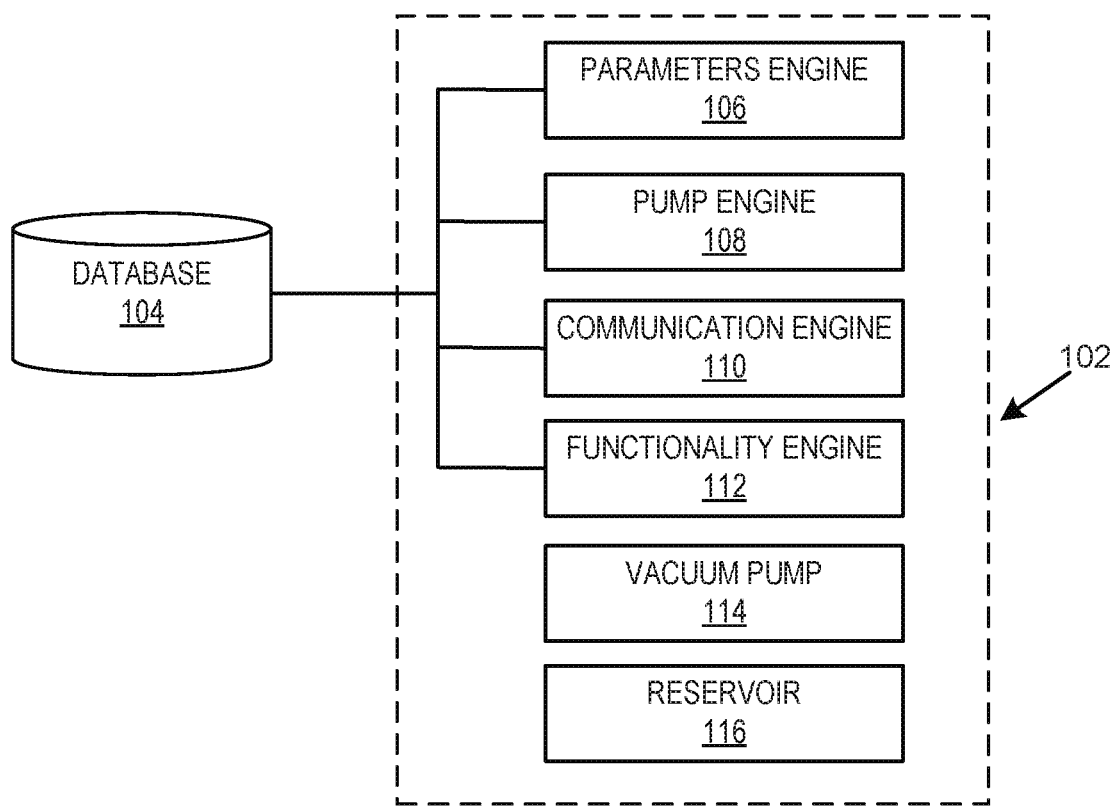
FIG. 1 illustrates a diagram of an example of a system for a scalable coolant distribution unit consistent with the present disclosure.

A number of methods, systems, and computer readable medium for a scalable coolant distribution unit are described herein. Coolant distribution units (CDUs) can utilize an enclosed loop to deliver conditioned liquid (e.g., water, coolant, etc.) to a number of computing devices. In some examples, the CDU delivers the conditioned liquid to cooling racks (e.g., rear door heat exchangers, etc.) that contain a number of server blades. The cooling racks can be contained within a particular data center.

In some examples a data center that includes a plurality of cooling racks can include a plurality of CDUs that are in a redundancy configuration (e.g., 1N, 2N, N+1, N+2, etc.). The data center can utilize a plurality of CDUs in a redundancy configuration to ensure that if a CDU fails another CDU is ready to be utilized to replace the failed CDU. Shutting down a failed CDU and activating a different CDU to replace the failed CDU can cause a number of problems. For example, a CDU that fails can cause problems with a level of liquid within reservoirs attached to the remaining functional CDUs. In this example, returning liquid from the failed CDU could return to a single reservoir of one of the remaining functional CDUs before a different CDU is activated to replace the failed CDU. The returning liquid can overflow the reservoir of the remaining functional CDUs, which can cause functionality problems with the vacuum systems of the remaining functional CDUs. The vacuum system can utilize a vacuum pump that can provide a liquid loop that is under vacuum. The vacuum system can be utilized to mitigate leaks which can damage equipment within a computing rack.

The scalable coolant distribution system as described herein can enable an uninterrupted transition of a failed CDU with a different functional CDU while minimizing the risk that returning liquid will overflow reservoirs of the remaining functional CDUs. The scalable coolant distribution system can enable communication between the plurality of CDUs for a data center. By enabling communication between the plurality of CDUs, received communication can be utilized by each of the plurality of CDUs when altering pump parameters to account for any CDU failures and/or CDU activations. For example, the scalable coolant distribution system can balance reservoir liquid levels of a plurality of CDUs by manipulating a vacuum pressure within each liquid reservoir of the plurality of CDUs. In this example, a CDU with a highest liquid reservoir level can decrease a vacuum pump pressure (e.g., increase pressure of the reservoir, etc.) and a CDU with a lowest liquid reservoir level can increase a vacuum pump pressure (e.g., decrease pressure of the reservoir, etc.) to create a condition that allows the liquid to move from the CDU with the highest liquid reservoir level to the CDU with the lowest liquid reservoir level. In this example, the liquid reservoir level can be determined based on the communication between the plurality of CDUs.

Figure 2:
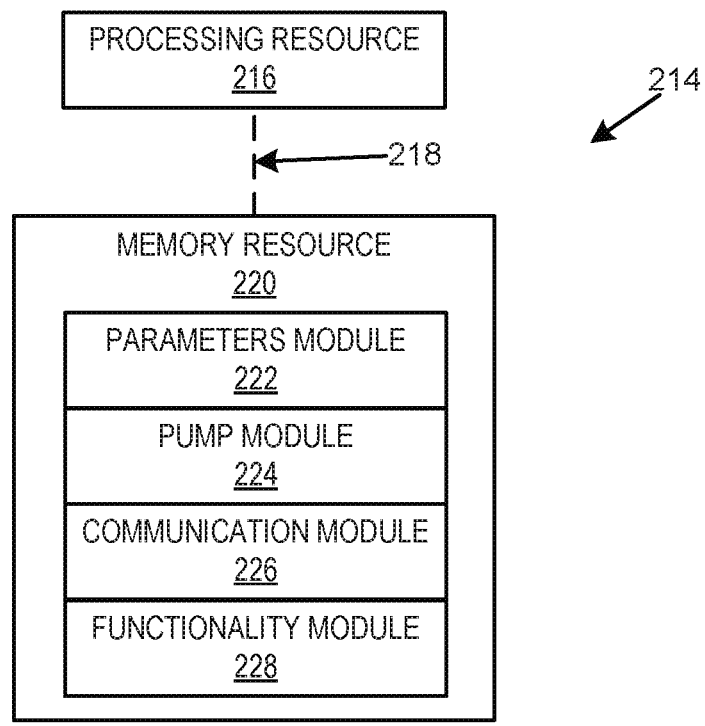
FIG. 2 illustrates a diagram of an example computing device consistent with the present disclosure.

FIGS. 1 and 2 illustrate examples of system 100 and computing device 214 consistent with the present disclosure. FIG. 1 illustrates a diagram of an example of a system 100 for a scalable coolant distribution unit consistent with the present disclosure. The system 100 can include a database 104, a scalable coolant distribution system 102, and/or a number of engines (e.g., parameters engine 106, pump engine 108, communication engine 110, functionality engine 112). The scalable coolant distribution system 102 can be in communication with the database 104 via a communication link, and can include the number of engines e.g., parameters engine 106, pump engine 108, communication engine 110, functionality engine 112). The scalable coolant distribution system 102 can include additional or fewer engines that are illustrated to perform the various functions as will be described in further detail in connection with FIGS. 3-7. Additionally, the scalable coolant distribution system 102 can include other components, such as vacuum pump 114, reservoir 116, or any other component necessary to implement the functionality described here.

The number of engines (e.g., parameters engine 106, pump engine 108, communication engine 110, functionality engine 112) can include a combination of hardware and programming, but at least hardware, that is configured to perform functions described herein (e.g., determine real time pump parameters of a first CDU, wherein the real time pump parameters correspond to a functionality of the first CDU, alter a pump speed of the first CDU based on the real time pump parameters, send the altered pump speed of the first CDU to a second CDU, alter the pump speed of the second CDU based on the altered pump speed of the first CDU and determined real time pump parameters of the second CDU, determine a functionality of the first CDU and the second CDU based on the real time pump parameters and altered pump speeds, etc.). The programming can include program instructions (e.g., software, firmware, etc.) stored in a memory resource (e.g., computer readable medium, machine readable medium, etc.) as well as hard-wired program (e.g., logic).

The parameters engine 106 can include hardware and/or a combination of hardware and programming, but at least hardware, to determine real time pump parameters of a first CDU, wherein the real time pump parameters correspond to a functionality of the first CDU. The parameters engine 106 can be coupled to a number of pump sensors that can be utilized to determine pump parameters in real time. The pump parameters can include, but are not limited to: a pump pressure, a pump speed, a reservoir level, a liquid temperature, among other parameters of the pump that can indicate a functionality of the pump. The pump parameters can include: a vacuum pump pressure, a determined pump speed, a representative value of the pump speed, a determined reservoir level, and/or a determined liquid temperature of a CDU.

In some examples, the parameters engine 106 can include hardware and/or a combination of hardware and programming, but at least hardware, to compare the real time pump parameters of the first CDU with the real time pump parameters of the second CDU to determine lowest reservoir level between the first CDU and the second CDU. As described herein, a CDU with a determined lowest reservoir level can activate a vacuum pump associated with a vacuum system. In some examples, the determined lowest reservoir level can also result in altering a pump speed of the CDU with the determined lowest reservoir level.

The pump engine 108 can include hardware and/or a combination of hardware and programming, but at least hardware, to alter pump parameters of the first CDU based on the real time pump parameters. The pump engine 108 can be coupled to a pump of the first CDU and alter the pump settings of the first CDU in order to alter a pump speed and/or vacuum pump pressure of the first CDU. The pump engine 108 can utilize the real time pump parameters to determine if an increased pump speed or a decreased pump speed is necessary to maintain the pump parameters within a threshold. For example, the first CDU can utilize a vacuum system that utilizes a top portion of a liquid reservoir attached to the first CDU. In this example, the level of liquid in the liquid reservoir can affect the vacuum system if the level of liquid is above a threshold level of the reservoir. In some examples, the pump engine 108 can alter the pump speed so that the level of liquid in the reservoir does not increase to a level above the threshold level.

The communication engine 110 can include hardware and/or a combination of hardware and programming, but at least hardware, to send the altered pump parameters of the first CDU to a second CDU. The communication engine 110 can be utilized to communicate pump parameters of the first CDU to the second CDU. For example, the real time pump speed of the first CDU can be determined and sent to the second CDU. In some examples, the determined real time pump speed can be converted into a representative value that can be sent to the second CDU. The second CDU can utilize the real time pump speed information, the pump parameters, and/or the altered pump speed of the first CDU to determine a functionality of the first CDU. In some examples, the second CDU can utilize the pump parameters of the first CDU to determine whether to alter the pump parameters of the second CDU.

The pump engine 108 can include hardware and/or a combination of hardware and programming, but at least hardware, to alter pump parameters of the second CDU based on the altered pump parameters of the first CDU and determined real time pump parameters of the second CDU. As described herein, the pump engine 108 can be utilized to alter the pump speed, vacuum pump pressure, and/or pump parameters of the second CDU based on the real time pump parameters of the first CDU. For example, it can be determined that the pump parameters of the first CDU indicate a CDU failure among a plurality of CDUs. In this example, a determined CDU failure can result in an increase in pump speed for the second CDU so that a flow of liquid within a system coupled to the first CDU and second CDU remains within a threshold (e.g., below an upper threshold and above a lower threshold, etc.). In some examples, the pump engine 108 can alter the pump speed of the second CDU based on a determined pump pressure of the first CDU.

The functionality engine 112 can include hardware and/or a combination of hardware and programming, but at least hardware, to determine a functionality of the first CDU and the second CDU based on the real time pump parameters and altered pump parameters. The functionality engine 112 can utilize the real time pump parameters and altered pump speeds of the first and second CDU to determine if the first and second CDU are functional (e.g., operating in a manner as expected, operating to manufacturers specifications, etc.). For example, the functionality engine 112 can utilize an increase in pump speed of the second CDU to determine that the first CDU is not functioning properly (e.g., first CDU is unable to maintain liquid pressure in the line, first CDU is unable to maintain liquid level in reservoir, etc.). The functionality engine 112 can also determine a functionality of a number of other CDUs operating in the same plurality of CDUs as the first CDU and the second CDU. For example, an increase in pump speed of the first CDU and the second CDU can indicate that a third CDU is not functioning properly.

FIG. 2 illustrates a diagram of an example computing device 214 consistent with the present disclosure. The computing device 214 can utilize software, hardware, firmware, and/or logic to perform functions described herein.

The computing device 214 can be any combination of hardware and program instructions configured to share information. The hardware, for example, can include a processing resource 216 and/or a memory resource 220 (e.g., computer-readable medium (CRM), machine readable medium (MRM), database, etc.). A processing resource 216, as used herein, can include any number of processors capable of executing instructions stored by a memory resource 220. Processing resource 216 may be implemented in a single device or distributed across multiple devices. The program instructions (e.g., computer readable instructions (CRI)) can include instructions stored on the memory resource 220 and executable by the processing resource 216 to implement a desired function (e.g., receive pump parameters from a first coolant distribution unit (CDU), wherein the pump parameters include a pump speed of the first CDU, alter pump parameters of a second CDU based on the received pump parameters of the first CDU and determined real time pump parameters of the second CDU, send the pump parameters of the second CDU to a third CDU, wherein the pump parameters of the second CDU include the altered pump parameters of the second CDU, determine when the one of the first CDU, the second CDU, or the third CDU are malfunctioning based on the altered pump parameters of the second CDU, etc.).

The memory resource 220 can be in communication with a processing resource 216. A memory resource 220, as used herein, can include any number of memory components capable of storing instructions that can be executed by processing resource 216. Such memory resource 220 can be a non-transitory CRM or MRM. Memory resource 220 may be integrated in a single device or distributed across multiple devices. Further, memory resource 220 may be fully or partially integrated in the same device as processing resource 216 or it may be separate but accessible to that device and processing resource 216. Thus, it is noted that the computing device 214 may be implemented on a participant device, on a server device, on a collection of server devices, and/or a combination of the participant device and the server device.

The memory resource 220 can be in communication with the processing resource 216 via a communication link (e.g., a path) 218. The communication link 218 can be local or remote to a machine (e.g., a computing device) associated with the processing resource 216. Examples of a local communication link 218 can include an electronic bus internal to a machine (e.g., a computing device) where the memory resource 220 is one of volatile, non-volatile, fixed, and/or removable storage medium in communication with the processing resource 216 via the electronic bus.

A number of modules (e.g., parameters module 222, pump module 224, communication module 226, functionality module 228) can include CRI that when executed by the processing resource 216 can perform functions. The number of modules (e.g., parameters module 222, pump module 224, communication module 226, functionality module 228) can be sub-modules of other modules. For example, the pump module 224 and the communication module 226 can be sub-modules and/or contained within the same computing device. In another example, the number of modules (e.g., parameters module 222, pump module 224, communication module 226, functionality module 228) can comprise individual modules at separate and distinct locations (e.g., CRM, etc.).

Each of the number of modules (e.g., parameters module 222, pump module 224, communication module 226, functionality module 228) can include instructions that when executed by the processing resource 216 can function as a corresponding engine as described herein. For example, the parameters module 222 can include instructions that when executed by the processing resource 216 can function as the parameters engine 106. In another example, the pump module 224 can include instructions that when executed by the processing resource 216 can function as the pump engine 108. In another example, the communication module 226 can include instructions that when executed by the processing resource 216 can function as the communication engine 110. Furthermore, the functionality module 228 can include instructions that when executed by the processing resource 216 can function as the functionality engine 112.

Figure 3:
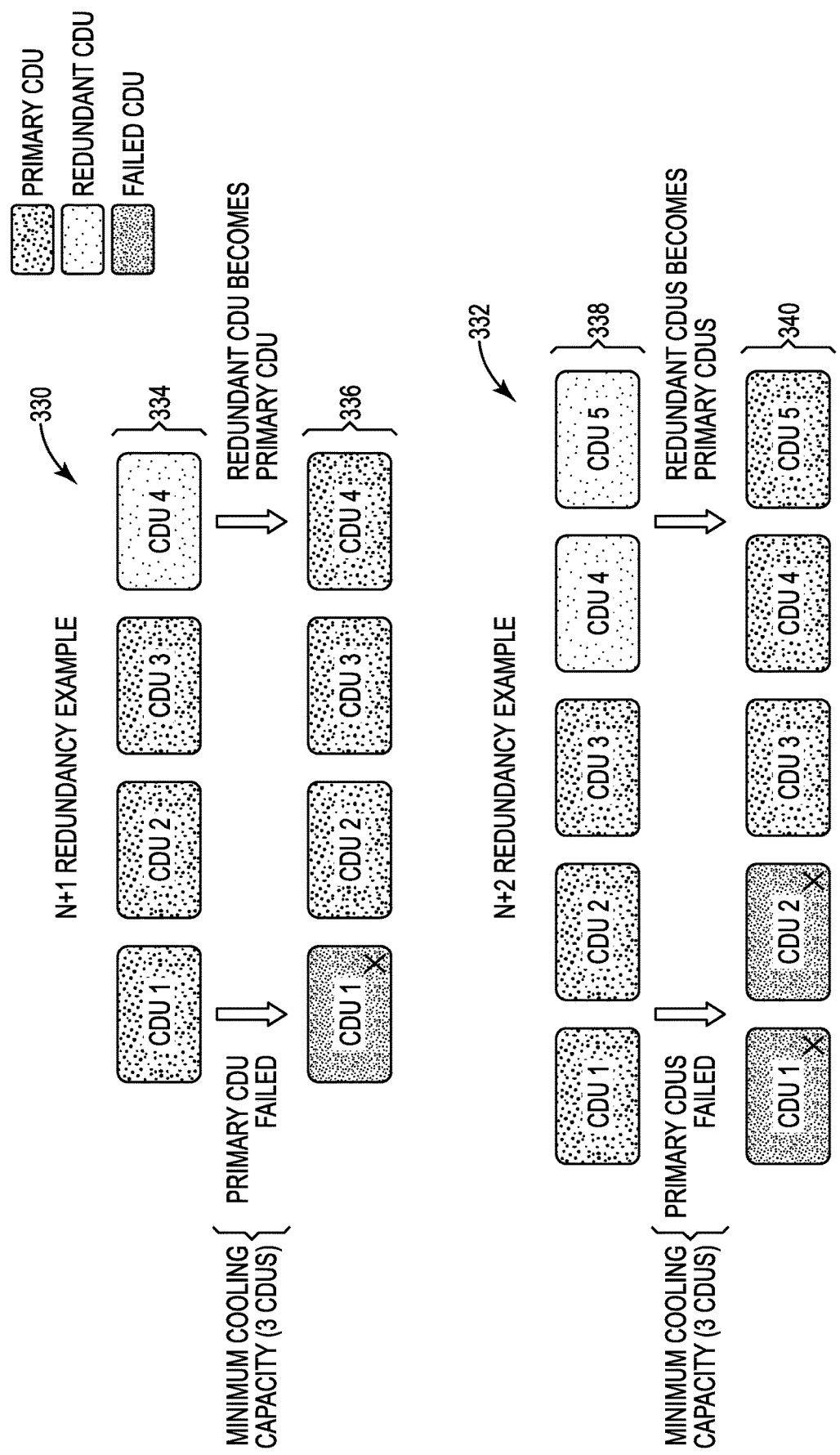
FIG. 3 illustrates a diagram of an example of a redundant coolant distribution system consistent with the present disclosure.

FIG. 3 illustrates a diagram of an example of a redundant coolant distribution system 330, 332 consistent with the present disclosure. The system 330 can be an example of an N+1 redundancy. An N+1 redundancy can be represented by a plurality of CDUs 334 (e.g., CDU 1, CDU 2, CDU 3, CDU 4, etc.). The system 330 can utilize three CDUs for a minimum cooling capacity (e.g., required cooling capacity, minimum number of CDUs needed to provide cooling to a number of racks within a datacenter). The system 330 can utilize CDU 1, CDU 2, and CDU 3 as primary CDUs (e.g., CDUs that are operating during run time).

In addition, the system 330 can include a redundant CDU (e.g., CDU 4) that is not running and can be activated when a primary CDU fails or becomes non-functional. For example, if CDU 1 fails or is not functional, CDU 4 can be activated so that a total of three CDUs are operating to provide cooling to the number of racks within a datacenter. That is, the plurality of CDUs 336 that are operating when CDU 1 fails are CDU 2, CDU 3, and CDU 4. In some examples, a redundant CDU (e.g., CDU 4) can be in standby mode. A redundant CDU in standby mode can rapidly be activated or come online when needed (e.g., when a primary CDU fails, etc.).

In some examples, the system 330 can utilize CDU 1, CDU 2, CDU 3, CDU 4, and CDU 5 simultaneously at less than max capacity (e.g., 75% capacity). In this example, activated and functional CDUs can be ramped up to max capacity (e.g., 100% capacity) when one of the CDUs fail. For example, CDU 1, CDU 2, CDU 3, CDU 4, and CDU 5 can be operating as primary CDUs at 70% capacity to provide a minimum cooling capacity. In this example, CDU 1, CDU 2, CDU 3, and CDU 4, can be increased to 100% capacity when CDU 5 fails to maintain the minimum cooling capacity. This example can be applied to a number of different redundancy systems (e.g., N+1, N+2, 2N, etc.).

The system 332 can be an example of an N+2 redundancy. The N+2 redundancy can operate similarly to the N+1 redundancy. The system 332 can have a minimum cooling capacity of three CDUs similarly to the N+1 redundancy. That is, the N+2 redundancy includes three primary CDUs (e.g., CDU 1, CDU 2, CDU 3) and also includes two redundant CDUs (e.g., CDU 4, CDU 5). Similar to the N+1 redundancy, if CDU 1 fails or is not functioning properly, CDU 4 or CDU 5 can be activated. In addition, if CDU 2 also fails or is not functioning properly, CDU 4 or CDU 5 can also be activated to provide the minimum cooling capacity for the racks within the data center.

The plurality of CDUs 338 shows that CDU 1, CDU 2, and CDU 3 are primary CDUs that are functioning properly with CDU 4 and CDU 5 not operating. The plurality of CDUs 340 shows that the primary CDU 1 and primary CDU2 are not functioning properly. The plurality of CDUs 340 also shows that redundant CDU 4 and redundant CDU 5 are activated to maintain the minimum cooling capacity of three CDUs (e.g., CDU 3, CDU 4, CDU 5 are activated and/or operating).

As described herein, the plurality of CDUs that are operational can utilize a vacuum system that utilizes air within a top portion of a reservoir coupled to each of the operational CDUs. When a primary CDU fails and a redundant CDU is activated to maintain the minimum cooling capacity, the level of liquid in the reservoir coupled to the operational CDUs can be difficult to maintain (e.g., maintain a level of liquid that is not below a threshold or above a threshold). As described further herein, the coolant distribution system can be utilized to share pump parameters and/or altered pump parameters. The pump parameters and/or altered pump parameters can be utilized to detect when a CDU is not functioning properly and/or to detect when the liquid level of a particular CDU is not within a threshold. As described herein, when the liquid level of the particular CDU is not within the threshold, the vacuum system can be utilized to increase a vacuum pump pressure and/or decrease the vacuum pump pressure based on the determined liquid level. For example, when the liquid level is below the threshold, the vacuum pump pressure can be increased and the reservoir pressure can be decreased. In this example, when the liquid level of a reservoir is above the threshold, the vacuum pump pressure can be decreased and the reservoir pressure can be increased. This example, can move liquid from a reservoir that is above the threshold to a reservoir that is below the threshold.

Figure 4:
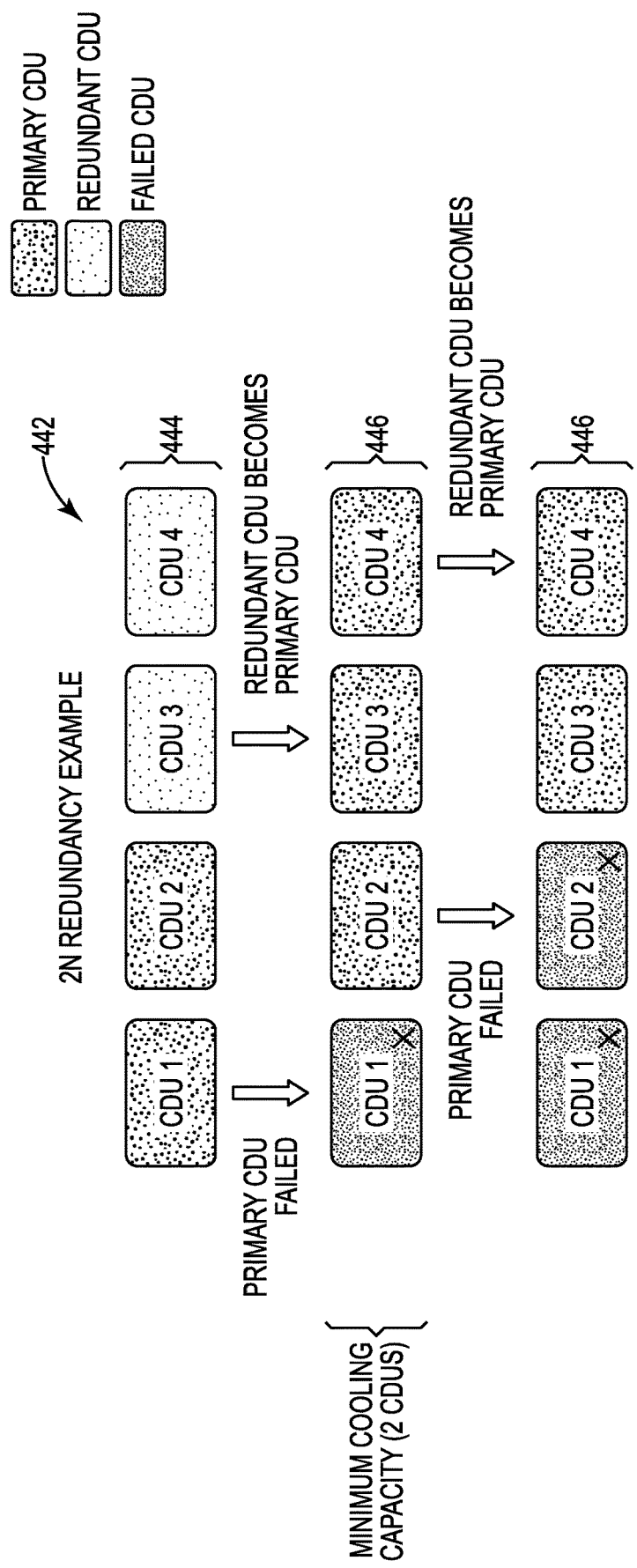
FIG. 4 illustrates a diagram of an example of a redundant coolant distribution system consistent with the present disclosure.

FIG. 4 illustrates a diagram of an example of a redundant coolant distribution system 442 consistent with the present disclosure. The system 442 can represent a 2N redundancy of CDUs. The system 442 can include a plurality of CDUs 444 (e.g., CDU 1, CDU 2, CDU 3, CDU 4, etc.). The system 442 can have a minimum cooling capacity of two CDUs (e.g., two CDUs are needed to maintain a cooling threshold of a number of racks within a data center). The plurality of CDUs 444 represent primary CDUs (e.g., CDU 1, CDU 2) and redundant CDUs (e.g., CDU 3, CDU 4). The plurality of CDUs 444 can represent when the primary CDUs are functioning properly and the redundant CDUs are not activated. The plurality of CDUs 446 can represent when primary CDU 1 fails and/or is not functioning properly and CDU 3 is activated to maintain the minimum cooling capacity. The plurality of CDUs 448 can represent when CDU 1 and CDU 2 fail and/or are not functioning properly and CDU 3 and CDU 4 are activated to maintain the minimum cooling capacity.

As described herein, the plurality of CDUs that are operational can utilize a vacuum system that utilizes air within a top portion of a reservoir coupled to each of the operational CDUs. When a primary CDU fails and a redundant CDU is activated to maintain the minimum cooling capacity, the level of liquid in the reservoir coupled to the operational CDUs can be difficult to maintain (e.g., maintain a level of liquid that is not below a threshold or above a threshold level that allows a fluid pump and a vacuum pump to function simultaneously). As described further herein, the coolant distribution system can be utilized to share pump parameters and pump speeds. The pump parameters and pump speeds can be utilized to detect when a CDU is not functioning properly and/or to detect when the liquid level of a particular CDU is not within a threshold.

Figure 5:
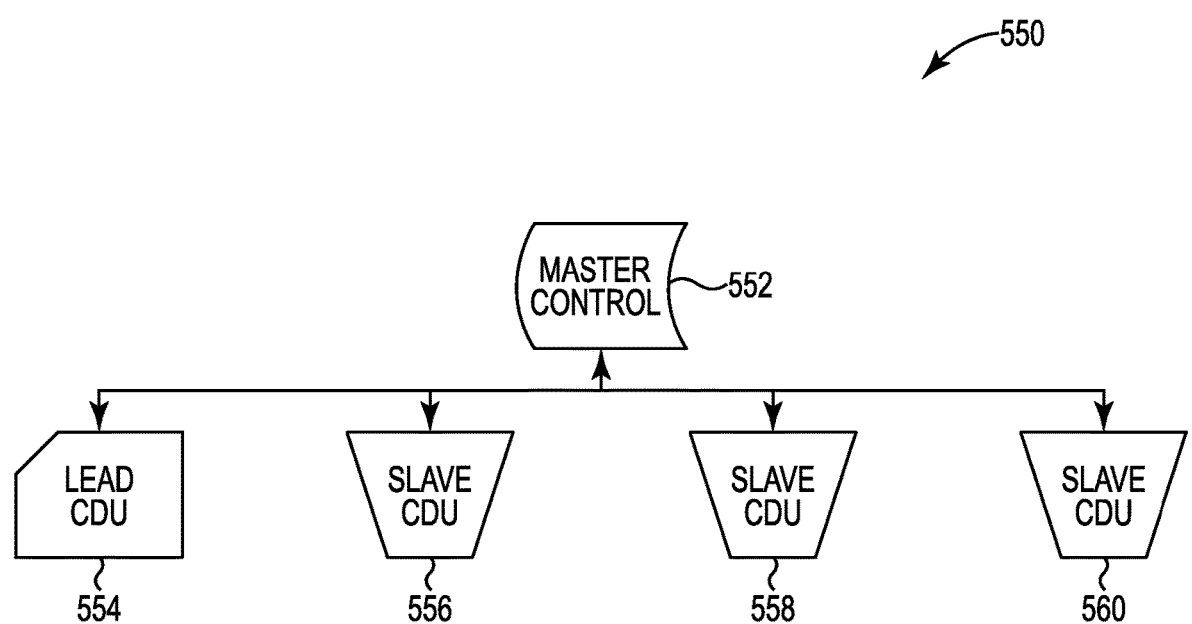
FIG. 5 illustrates a diagram of an example of a scalable coolant distribution system consistent with the present disclosure.

FIG. 5 illustrates a diagram of an example of a scalable coolant distribution system 550 consistent with the present disclosure. In some examples, the system 550 can include a master control 552. The master control 552 can receive communication and/or send instructions to each of the CDUs 554, 556, 558, 560 to change pump parameters (e.g., pump speed, pump torque, etc.) of one or more of the CDUs 554, 556, 558, 560. The master control 552 can be utilized to determine and maintain a liquid level of a number of reservoirs coupled to each of the CDUs 554, 556, 558, 560. As described herein, each CDU can be coupled to a designated liquid reservoir that can be utilized by the CDU.

In some examples, the master control 552 can receive pump parameters from each of the CDUs 554, 556, 558, 560 and determine how to alter pump parameters for each of the CDUs 554, 556, 558, 560 based on the received pump parameters. For example, each of the CDUs 554, 556, 558, 560 can send a pump speed and liquid level of a corresponding liquid reservoir. In this example, the master control 552 can determine how pump parameters of each of the CDUs 554, 556, 558, 560 can be altered in order to maintain the liquid reservoirs of each of the CDUs 554, 556, 558, 560. In addition, the master control 552 can utilize the received pump parameters to determine if any of the CDUs 554, 556, 558, 560 are non-functional.

In some examples, the system 550 can include a lead CDU 554. In some examples, the lead CDU 554 can be utilized instead of the master control 552. That is, the master control 552 is not utilized to maintain pump parameters of the CDUs 554, 556, 558, 560. Thus, each of the CDUs 554, 556, 558, 560 are responsible for receiving pump parameters from other CDUs 554, 556, 558, 560 and determining how to alter pump parameters based on the received pump parameters.

The lead CDU 554 can be utilized as a starting CDU. The lead CDU 554 can determine pump parameters of the lead CDU 554 and make pump parameter adjustments (e.g., pump speed adjustments, pump torque adjustments, etc.). The lead CDU 554 can send the determined pump parameters and/or the pump parameter adjustments to at least one of the slave CDUs 556, 558, 560. In some examples, the lead CDU 554 can send the determined pump parameters and/or the pump parameter adjustments to each of the slave CDUs 556, 558, 560. In some examples, the lead CDU 554 can send the determined pump parameters and/or pump parameters adjustments to CDU 556 and CDU 556 can send determined pump parameters and/or pump parameters adjustments of CDU 556 to CDU 558. The liquid level of the number of reservoirs can be controlled by sending the pump parameters and/or pump parameter adjustments to each of the CDUs 554, 556, 558, 560.

In some examples, the liquid level of the number of reservoirs can be maintained by sending and/or receiving pump parameters and pump parameter adjustments even when one or more of the CDUs 554, 556, 558, 560 fails or becomes non-functional. For example, if CDU 556 becomes non-functional, the liquid level of the number of reservoirs for CDUs 554, 558, 560 can be maintained by adjusting pump parameters of the CDUs 554, 558, 560 based on received pump parameters and/or pump parameter adjustments. For example, the pump speed or pump torque can be increased for CDUs 554, 558, 560 so the liquid level of the reservoirs for CDUs 554, 558, 560 can be maintained when CDU 556 becomes non-functional.

Maintaining the liquid level of the reservoirs can include maintaining a level of liquid that allows the CDUs 554, 556, 558, 560 to utilize the liquid within the reservoir for pumping liquid through a cooling system and to remove air from a top portion of the liquid reservoir to create a vacuum in the cooling system coupled to the CDUs 554, 556, 558, 560. That is, maintaining the liquid level of the reservoirs can include maintaining the level of liquid within a threshold when one or more CDUs 554, 556, 558, 560 fails or become non-functional.

The system 550 can be utilized to maintain pump parameters of the CDUs 554, 556, 558, 560 when one or more of the CDUs 554, 556, 558, 560 fails or becomes non-functional. The system 550 can be utilized to automatically share pump parameters between the CDUs 554, 556, 558, 560 and adjust pump parameters based on received pump parameters and pump adjustments from other CDUs 554, 556, 558, 560.

Figure 6:
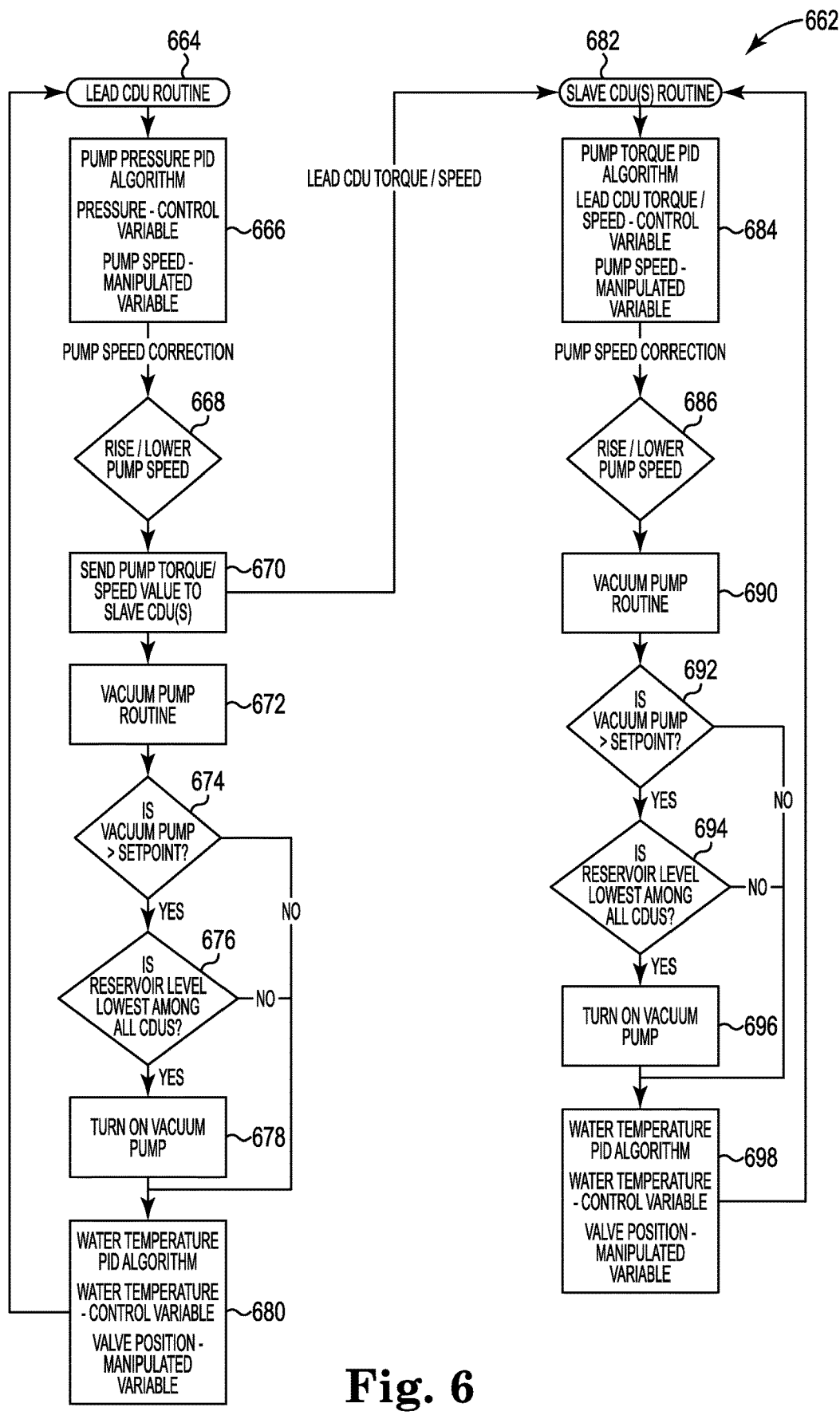
FIG. 6 illustrates a diagram of an example of a process for a scalable coolant distribution unit consistent with the present disclosure.

FIG. 6 illustrates a diagram of an example of a process 662 for a scalable coolant distribution unit consistent with the present disclosure. The process 662 can be utilized to share pump parameters and/or pump parameter adjustments between a plurality of CDUs. The process 662 can be separated into a process 664 for a lead CDU and a process 682 for a number of slave CDUs.

The process 664 for the lead CDU can include determining a number of pump parameters 666. Determining the number of pump parameters 666 can include determining a pump pressure, determining a pressure control of the CDU, determining a water temperature, monitoring liquid and/or air leaks within the system, and/or determining a pump speed of the CDU among other parameters as described herein. The process 664 can include altering the pump speed 668 of the CDU based on the determined pump parameters 666. The process 664 can include sending the pump parameters and/or the altered pump parameters to the number of slaves 670.

The process 664 can also include a vacuum pump routine 672. The vacuum pump routine 672 can include determining if the vacuum pump is greater than a set point 674 for the vacuum pump. When the vacuum pump is greater than a set point (e.g., a set value of vacuum pressure within the system) the vacuum pump routine 672 can determine if the reservoir level of the CDU is the lowest reservoir level among a plurality of other CDUs. Determining if the reservoir level of the CDU is the lowest reservoir level among a plurality of other CDUs can include comparing a determined reservoir level with shared pump parameters from the other plurality of CDUs.

When the reservoir level is the lowest reservoir level among the plurality of other CDUs the vacuum pump can be activated 678 to increase a vacuum pump pressure and/or decrease a pressure of the reservoir. In some examples, when the vacuum pump is determined to be less than a set point the vacuum pump routine 672 can skip determining the reservoir level 676 and/or activating the vacuum pump 678. In some examples, when the reservoir level is not at a lowest level compared to other CDUs, the vacuum pump routine 672 can skip activating the vacuum pump 678.

The vacuum pump routine 672 can include determining a number of additional pump parameters 680. The number of additional pump parameters can include water temperature and/or valve position of the CDU pump. Upon determining the number of additional pump parameters 680, the lead CDU routine 664 can begin again. In some examples, the vacuum pump routine 672 can be independent of determining the number of additional pump parameters 680 (e.g., valve routine, etc.). That is, determining the number of additional pump parameters 680 can be determined before the vacuum pump routine 672 and/or in place of the vacuum pump routine 672.

In some examples, sending the pump parameters 670 to one or more of the slave CDUs can initiate a slave CDU routine 682 for the one or more slave CDUs based on the received pump parameters. The slave CDU routine 682 can include utilizing the lead CDU pump parameters for comparing the lead CDU pump parameters to determine pump parameters of the slave CDU 684. The slave CDU routine 682 can include altering a pump parameters 686 of the slave CDU based on the comparison of pump parameters 684.

The slave CDU routine 682 can include a vacuum pump routine 690. The vacuum pump routine 690 can include determining whether the vacuum pump is greater than a set point 692. When the vacuum pump is greater than the set point the vacuum pump routine 690 can include determining if the reservoir of the slave CDU is lowest among a plurality of other CDUs 694. When the reservoir is the lowest among a plurality of other CDUs the vacuum pump of the CDU can be activated 696.

In some examples, the slave CDU routine 682 can include determining a number of additional pump parameters 698. The additional pump parameters can include a liquid temperature and/or a valve position of the CDU. The process 662 can be utilized to share pump parameters between a plurality of CDUs to maintain a liquid level in a number of different reservoirs coupled to a plurality of CDUs. In addition, the process 662 can be utilized to maintain a liquid level in the number of different reservoirs when a number of CDUs fail and/or become non-functional.

Figure 7:
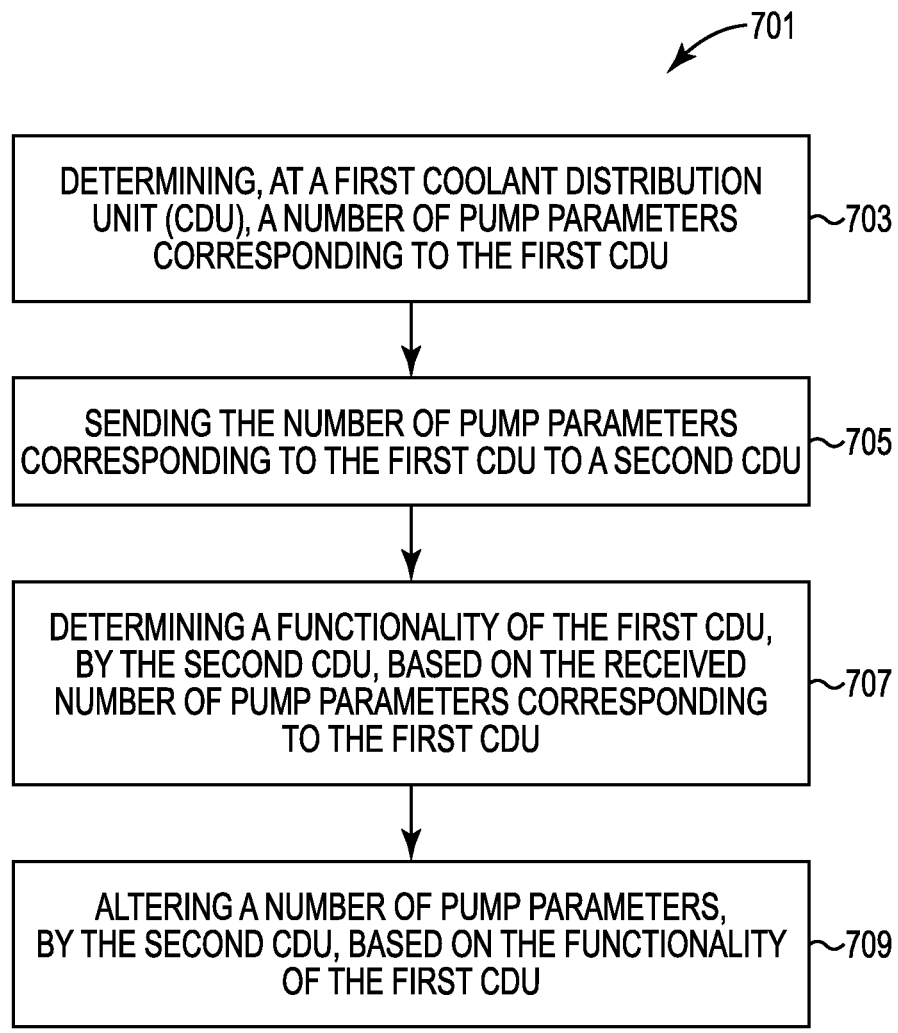
FIG. 7 is a flow chart of an example of a method for scalable coolant distribution consistent with the present disclosure.

FIG. 7 is a flow chart of an example of a method 701 for scalable coolant distribution consistent with the present disclosure. The method 701 can be executed by computing device as described herein. The method 701 can be utilized to maintain a liquid level of a number of reservoirs coupled to a number of CDUs by sharing pump parameters between the number of CDUs. The method 701 can ensure that the liquid level of the number of reservoirs is maintained within a threshold to ensure that there is enough liquid, but not an excess quantity of liquid even when there is a CDU failure and/or non-functional CDU.

At 703 the method 701 can include determining, at a first coolant distribution unit (CDU), a number of pump parameters corresponding to the first CDU. As described herein, the number of pump parameters can include, but is not limited to: a pump pressure, a control variable of the pump, a pump speed, a pump torque, a water temperature, a reservoir level, and/or a valve position.

At 705 the method 701 can include sending the number of pump parameters corresponding to the first CDU to a second CDU. The first CDU and the second CDU can be communicatively coupled and share information by sending and/or receiving the information via a communicatively coupled communication path (e.g., wireless communication, near-field communication, Bluetooth, WIFI, Ethernet, etc.). The first CDU can send the parameters to the second CDU in a manner described herein. In some examples, the first CDU can be a lead CDU and the second CDU can be a slave CDU as described herein.

At 707 the method 701 can include determining a functionality of the first CDU, by the second CDU, based on the received number of pump parameters corresponding to the first CDU. Determining the functionality of the first CDU can include determining whether the first CDU is functioning based on the received pump parameters of the first CDU. For example, the second CDU can determine that the first CDU is non-functional when the received pump speed of the first CDU is below a threshold pump speed. In some examples, determining the functionality of the first CDU includes comparing the pump parameters corresponding to the first CDU to a number of threshold values to determine whether the pump parameters are within the threshold values.

At 709 the method 701 can include altering a number of pump parameters, by the second CDU, based on the functionality of the first CDU. Altering the number of pump parameters can include increasing or decreasing a pump speed of the CDU. In some examples, altering the number of pump parameters can include altering a vacuum pump and/or pump parameters to control a liquid level within a reservoir coupled to the CDU. In some examples, a non-functional first CDU can cause a reservoir of the second CDU to increase to a level that is above a threshold, which can cause the second CDU to malfunction (e.g., reservoir overflow, not enough air within the reservoir for the vacuum pump functions, etc.). In order to maintain the liquid level of the reservoir coupled to the second CDU, the second CDU can utilize the number of received pump parameters to alter pump parameters of the second CDU.

In some examples, the method 701 can include sending, by the second CDU, the alterations of the number of pump parameters of the second CDU to the first CDU. That is, the second CDU can share how the second CDU altered the number of pump parameters for the second CDU based on the pump parameters received from the first CDU. In some examples, the method 701 can also include determining a functionality of the second CDU, by the first CDU, based on the received alterations of the number of pump parameters of the second CDU.

The method 701 can be utilized to maintain the liquid level of a plurality of reservoirs that are coupled to a plurality of CDUs by communicating pump parameters between each of the plurality of CDUs. The method 701 can utilize a communication network between each of the plurality of CDUs as described herein. The method 701 can be utilized in a number of different redundant CDU systems to maintain the liquid level of the operational CDUs when a number of CDUs become non-functional and/or fail.

As used herein, "logic" is an alternative or additional processing resource to perform a particular action and/or function, etc., described herein, which includes hardware, e.g., various forms of transistor logic, application specific integrated circuits (ASICs), etc., as opposed to computer executable instructions, e.g., software firmware, etc., stored in memory and executable by a processor. Further, as used herein, "a" or "a number of" something can refer to one or more such things. For example, "a number of widgets" can refer to one or more widgets.

The above specification, examples and data provide a description of the method and applications, and use of the system and method of the present disclosure. Since many examples can be made without departing from the spirit and scope of the system and method of the present disclosure, this specification merely sets forth some of the many possible example configurations and implementations.

What is claimed is:

1. A system for scalable coolant distribution, comprising:
    a parameters engine to determine real time pump parameters of a first coolant distribution unit (CDU), wherein the real time pump parameters correspond to a functionality of the first CDU, a CDU being a device that utilizes an enclosed loop to deliver conditioned liquid to one or more computing devices;
    a pump engine to alter pump parameters of the first CDU based on the real time pump parameters;
    a communication engine to send the altered pump parameters of the first CDU to a second CDU;
    the pump engine to alter pump parameters of the second CDU based on the altered pump parameters of the first CDU and determined real time pump parameters of the second CDU; and
    a functionality engine to determine a functionality of the first CDU and the second CDU based on the real time pump parameters and altered pump parameters.

2. The system of claim 1, wherein the pump parameters include:
    a vacuum pump pressure;
    a reservoir level; and
    a liquid temperature of a corresponding CDU.

3. The system of claim 1, wherein the parameters engine is configured to compare the real time pump parameters of the first CDU with the real time pump parameters of the second CDU to determine lowest reservoir level between the first CDU and the second CUL.

4. The system of claim 1, wherein the pump engine is configured to alter the pump parameters of the second CDU based on a reservoir level of the first CDU.

5. The system of claim 1, wherein the communication engine is configured to send the real time pump parameters of the first CDU to the second CDU.

6. The system of claim 1, wherein the pump engine is configured to alter the pump parameters of the second CDU based on a determined pump pressure of the first CDU.

7. A non-transitory computer readable medium storing instructions executable by a processor processing for scalable coolant distribution, wherein the instructions are executable to:
    receive pump parameters from a first coolant distribution unit (CDU), a CDU being a device that utilizes an enclosed loop to deliver conditioned liquid to one or more computing devices, wherein the pump parameters include a pump speed of the first CDU;
    alter pump parameters of a second CDU based on the received pump parameters of the first CDU and determined real time pump parameters of the second CDU;
    send the pump parameters of the second CDU to a third CDU, wherein the pump parameters of the second CDU include the altered pump parameters of the second CDU; and
    determine when the one of the first CDU, the second CDU, or the third CDU are malfunctioning based on the altered pump parameters of the second CDU.

8. The medium of claim 7, wherein the instructions to alter pump parameters of the second CDU include instructions to alter a pump speed of the second CDU based on the pump speed of the first CDU.

9. The medium of claim 7, comprising instructions to determine a value representing an altered pump speed of the second CDU.

10. The medium of claim 9, wherein the instructions to determine the value include instructions to determine when the first CDU, the second CDU, or the third CDU are malfunctioning based on the value.

11. A method for scalable coolant distribution, comprising:
    determining, at a first coolant distribution unit (CDU), a number of pump parameters corresponding to the first CDU, a CDU being a device that utilizes an enclosed loop to deliver conditioned liquid to one or more computing devices;
    sending the number of pump parameters corresponding to the first CDU to a second CDU;
    determining a functionality of the first CDU, by the second CDU, based on the received number of pump parameters corresponding to the first CDU; and
    altering a number of pump parameters, by the second CDU, based on the functionality of the first CDU.

12. The method of claim 11, wherein determining a functionality of the first CDU includes comparing the pump parameters corresponding to the first CDU to a number of threshold values to determine whether the pump parameters are within the threshold values.

13. The method of claim 11, comprising sending, by the second CDU, the alterations of the number of pump parameters of the second CDU to the first CDU.

14. The method of claim 13, comprising determining a functionality of the second CDU, by the first CDU, based on the received alterations of the number of pump parameters of the second CDU.

15. The system of claim 1, wherein the parameters engine is adapted to compare the real time pump parameters of the first CDU to a number of threshold values to determine whether the real time pump parameters of the first CDU are within the threshold values.

16. The medium of claim 7, wherein the instructions to receive pump parameters include instructions to receive:
    a vacuum pump pressure;
    a reservoir level; and
    a liquid temperature of a corresponding CDU.

17. The medium of claim 7, further comprising instructions to compare real time pump parameters of the first CDU with the real time pump parameters of the second CDU to determine a lowest reservoir level between the first CDU and the second CDU.

18. The method of claim 11, wherein the pump parameters include:
    a vacuum pump pressure;
    a reservoir level; and
    a liquid temperature of a corresponding CDU.

19. The method of claim 11, further comprising comparing real time pump parameters of the first CDU with real time pump parameters of the second CDU to determine a lowest reservoir level between the first CDU and the second CDU.

\* \* \* \* \*